(12) United States Patent
Dause et al.

(10) Patent No.: US 7,847,200 B2
(45) Date of Patent: Dec. 7, 2010

(54) DEVICES, SYSTEMS, AND/OR METHODS FOR ELECTRICALLY COUPLING A HIGH VOLTAGE ELECTRIC MOTOR

(75) Inventors: Kevin Dause, Loveland, OH (US); David Beckman, Loveland, OH (US); William Finley, Cincinnati, OH (US); Benjamin Flick, Cincinnati, OH (US); Michael Laubenthal, Wirfus (DE)

(73) Assignee: Siemens Industry, Inc., Alpharetta, GA (US)

( * ) Notice: Subject to any disclaimer, the term of this patent is extended or adjusted under 35 U.S.C. 154(b) by 453 days.

(21) Appl. No.: 11/857,637

(22) Filed: Sep. 19, 2007

(65) Prior Publication Data

US 2009/0066270 A1 Mar. 12, 2009

Related U.S. Application Data

(63) Continuation-in-part of application No. 11/851,704, filed on Sep. 7, 2007, now abandoned.

(60) Provisional application No. 60/842,810, filed on Sep. 7, 2006.

(51) Int. Cl.
*H05K 7/02* (2006.01)

(52) U.S. Cl. .................. 174/541; 174/542; 174/58; 174/60

(58) Field of Classification Search .......... 174/60, 174/63, 535, 541, 58, 50.6, 481, 503, 542
See application file for complete search history.

(56) References Cited

U.S. PATENT DOCUMENTS

| | | | | |
|---|---|---|---|---|
| 3,755,616 | A * | 8/1973 | Toth et al. ............ 174/120 SR |
| 4,754,179 | A * | 6/1988 | Capuano et al. ............ 310/71 |
| 5,654,525 | A * | 8/1997 | Starozik .................. 174/481 |
| 5,665,939 | A * | 9/1997 | Jorgensen et al. ....... 174/50.52 |
| 6,107,567 | A * | 8/2000 | Blalock .................... 174/58 |
| 6,274,811 | B2 * | 8/2001 | Blalock .................... 174/58 |
| 6,963,495 | B1 * | 11/2005 | Carullo et al. ............ 361/818 |
| 2004/0065461 | A1 * | 4/2004 | Browning et al. .......... 174/50 |
| 2008/0053698 | A1 * | 3/2008 | Purves et al. ............ 174/520 |

* cited by examiner

*Primary Examiner*—Hung V Ngo
(74) *Attorney, Agent, or Firm*—Filip A. Kowalewski

(57) ABSTRACT

Certain exemplary embodiments can provide a terminal box adapted to be releasably and/or operatively attached to a selected electric motor of a plurality of electric motors. The terminal box can be adapted to receive a plurality of electrical wires. The plurality of electrical wires can be adapted to convey electrical energy to the selected electric motor.

11 Claims, 7 Drawing Sheets

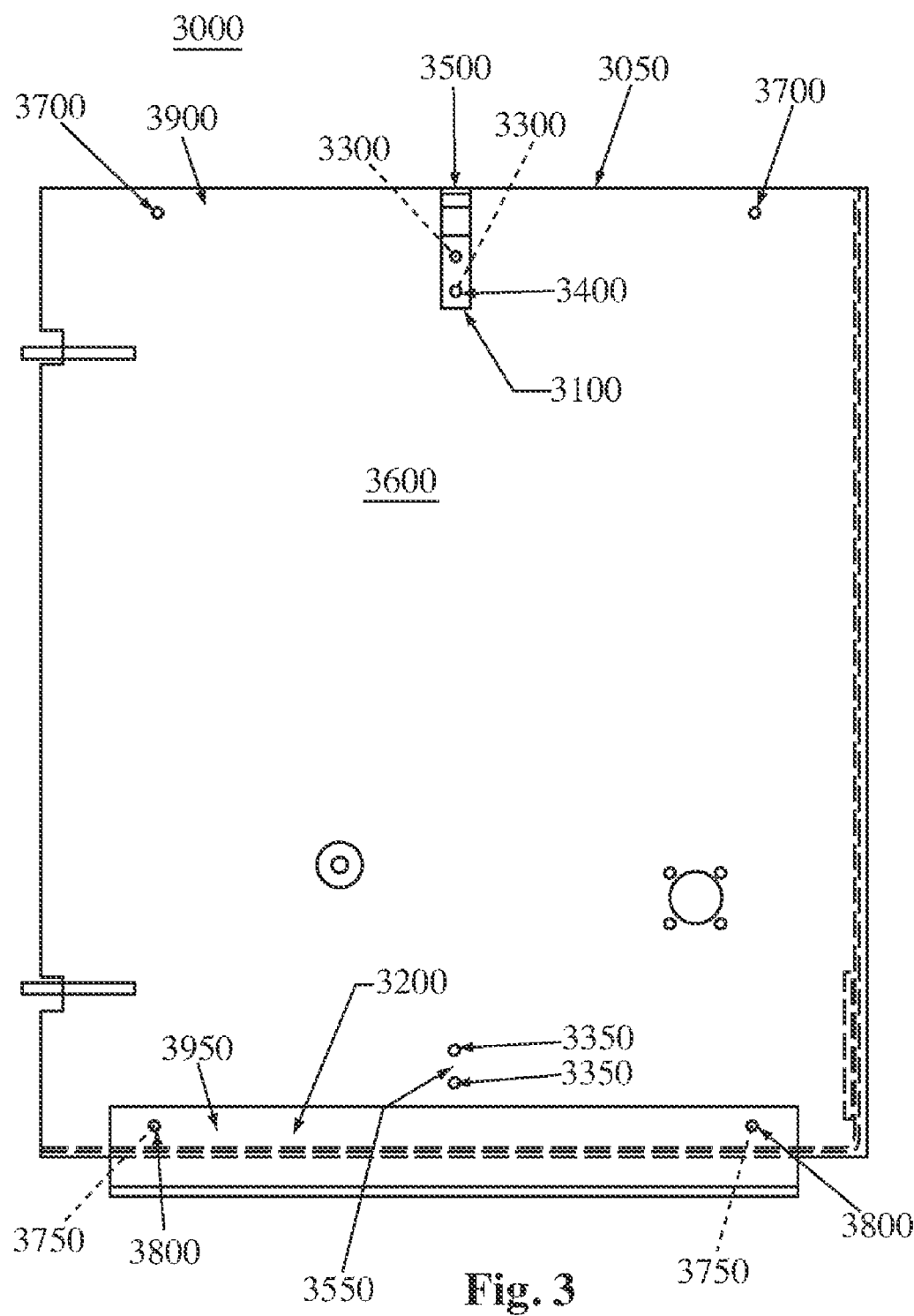

6000

DEVICES, SYSTEMS, AND/OR METHODS FOR ELECTRICALLY COUPLING A HIGH VOLTAGE ELECTRIC MOTOR

CROSS-REFERENCES TO RELATED APPLICATIONS

This application claims priority to, and incorporates by reference herein in its entirety, pending U.S. Provisional Patent Application Ser. No. 60/842,810 filed Sep. 7, 2006 claims priority to and incorporates by reference herein in its entirety, and is a Continuation-In-Part of U.S. non-provisional patent application Ser. No. 11/851,704 filed 7 Sep. 2007 now abandoned.

BACKGROUND

An electric motor can be coupled to a source of electrical energy via a terminal box. The terminal box can have a variety of designs and/or arrangements. New and unique arrangements and/or configurations of terminal boxes can be designed for certain electric motors. Design and fabrication of unique arrangements and/or configurations of terminal boxes for electric motors, such as induction motors, can be relatively costly.

SUMMARY

Certain exemplary embodiments can provide a terminal box adapted to be releasably and/or operatively attached to a selected electric motor of a plurality of electric motors. The terminal box can be adapted to receive a plurality of electrical wires. The plurality of electrical wires can be adapted to convey electrical energy to the selected electric motor.

BRIEF DESCRIPTION OF THE DRAWINGS

A wide variety of potential practical and useful embodiments will be more readily understood through the following detailed description of certain exemplary embodiments, with reference to the accompanying exemplary drawings in which:

FIG. 3 is a side view of an exemplary embodiment of a terminal box system 3000;

DETAILED DESCRIPTION

Figure 1:
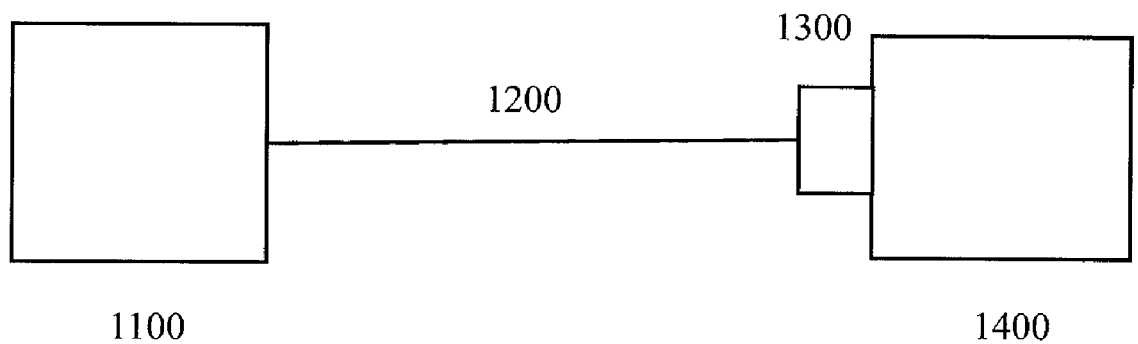
FIG. 1 is a block diagram of an exemplary embodiment of a system 1000.

Certain exemplary embodiments can provide a terminal box adapted to be releasably and/or operatively attached to a selected electric motor of a plurality of electric motors. The terminal box can be adapted to receive a plurality of electrical wires. The plurality of electrical wires can be adapted to convey electrical energy to the selected electric motor.

In certain exemplary embodiments, instead of designing a new terminal box for each motor design and/or configuration, a standardized terminal box can be configured for use with a plurality of electric motors. The terminal box can be relatively robust and/or can be utilized for electric motors of a plurality of different sizes. The terminal box can be adapted to house many motor accessories and/or can be designed and/or constructed utilizing configuration software adapted to automatically produce a bill of material for the terminal box.

The terminal box can comprise one or more of the following features:
- a NEMA Type II enclosure, which can be rated for use with electrical energy of up to 13800 volts;
- a removable back plate with different dimensions;
- interchangeable feet and lifting hooks;
- capacity for lightning arresters;
- capacity for surge capacitors;
- capacity for space heater;
- capacity for one or more current transformers and/or metering current transformers;
- a removable neutral link;
- a removable bottom plate;
- meets one or more American Petroleum Institute specifications; and/or
- breather drain; etc.

In certain exemplary embodiments, via a symmetrical design and/or interchangeability of the back plate, lifting hooks, and/or feet, a given box can be used for different configurations of various electric motor frame types. For terminal boxes that support up to 6,600 volts, by changing locations of feet and/or lifting hooks, certain terminal boxes can provide for top and/or bottom entry of electrical wires, such as electrical cables. In certain exemplary embodiments, by rotating and/or flipping the back plate, an aperture location on a back of the terminal box can be changed so the box can be used for different motors.

Certain exemplary embodiments can comprise design and/or fabrication of a universal terminal box adapted for use with a plurality of electric motors between approximately 500 horsepower and approximately 10,000 horsepower. The terminal box can be a NEMA/ANSI type II terminal box. In certain exemplary embodiments, the enclosure of the terminal box can be a NEMA 4 enclosure. A terminal box that supports up to 6,600 volts can comprise a plurality of non-destructively releasably attached lifting hooks, which can be non-destructively releasably attached at a plurality of locations on the terminal box. The terminal box can comprise a plurality of substantially non-destructively releasably attached feet, which can be substantially non-destructively releasably attached at a plurality of locations on the terminal box. The terminal box can comprise a removable back plate, which defines an opening that can be adapted to receive electrical wires. The electrical wires can electrically couple the electric motor to an electrical energy source. A back plate of the terminal box can be adapted to be flippably and/or rotatably attached to the terminal box such that the opening can be positioned in at least four locations relative to a front panel center location of the terminal box. In certain exemplary embodiments, a removable plate can be adapted to allow the terminal box to receive the electrical wires from either above or below the terminal box. Components housed by the terminal box can be located in specific and/or predetermined locations within the terminal box.

FIG. 1 is a block diagram of an exemplary embodiment of a system 1000, which can comprise an electrical energy source 1100 and an electric motor 1400. Electrical energy source 1100 can be electrically coupled to electric motor 1400 via a plurality of electrical wires 1200 and a terminal box 1300.

Figure 2:
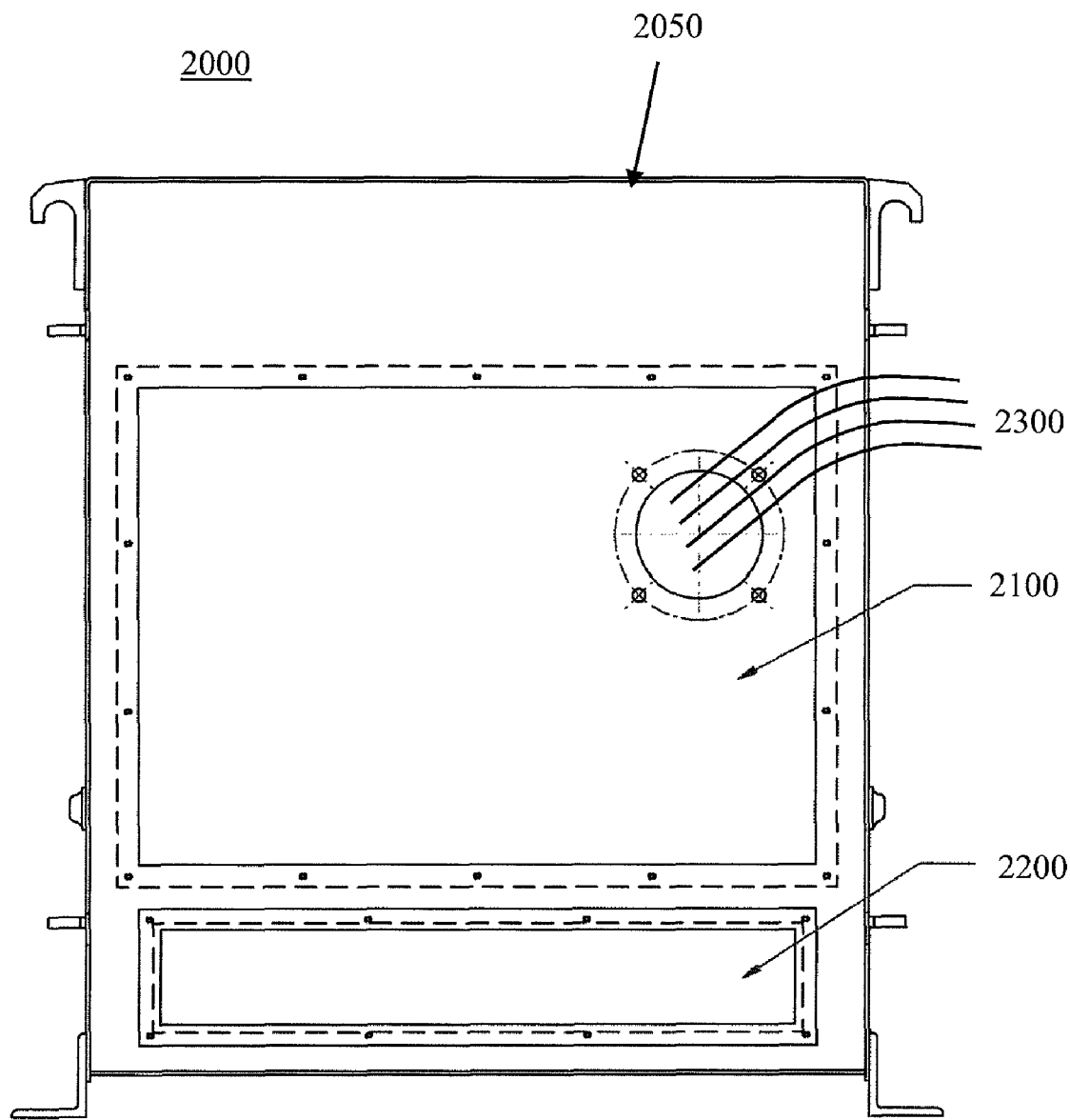
FIG. 2 is a back view of an exemplary embodiment of a terminal box system 2000.

FIG. 2 is a back view of an exemplary embodiment of a terminal box system 2000, which can comprise a terminal box 2050, a back plate 2100, and a blowout panel 2200. Terminal box system 2000 can be adapted to be substantially non-destructively releasably and/or operatively attached to a selected electric motor of a plurality of electric motors. Terminal box 2050 can be adapted to receive a plurality of electrical wires 2300, which can be adapted to convey electrical energy to the selected electric motor. The plurality of electric motors can have a power output of a range between approximately 500 horsepower and approximately 10,000 horsepower. When operatively coupled to any of the plurality of electric motors, terminal box 2050 can be adapted to house components operatively coupled to, and/or sized for, each of the plurality of electric motors. Blowout panel 2200 can be adapted to release an excess of electrical energy from terminal box 2050. Terminal box 2050 can be compliant with one or more American Petroleum Institute standards for electric motor terminal boxes. Terminal box 2050 can be a NEMA/ANSI type II terminal box.

FIG. 3 is a side view of an exemplary embodiment of a terminal box system 3000 that can support up to 6600 volts, which can comprise a terminal box 3050, a first lifting hook 3100, and a first foot 3200. An opposing side of the terminal box to that illustrated in FIG. 3 can comprise a substantially non-destructively releasably attached second foot of a pair of feet and a substantially non-destructively releasably attached second lifting hook of a pair of lifting hooks.

The pair of lifting hooks can be adapted to be non-destructively releasably attached to terminal box 3050. Terminal box 3050 can define a first set of hook openings 3300 and a second set of hook openings 3350. First set of hook openings 3300 can be adapted to receive fasteners 3400, which can be adapted to substantially non-destructively mount the pair of lifting hooks to first pair of lifting hook mounting sites 3500. Second set of hook openings 3350 can be adapted to receive fasteners 3400, which can be adapted to substantially non-destructively mount the pair of lifting hooks to a second pair of lifting hook mounting sites 3550. Each of first pair of lifting hook mounting sites 3500 can be at an opposing end region of a surface 3600 compared to a corresponding mounting site of second pair of lifting hook mounting sites 3550.

The pair of feet adapted to be substantially non-destructively releasably attached to terminal box 3050. Terminal box 3050 can define a first set of foot openings 3700 and a second set of openings 3750. First set of openings 3700 can be adapted to receive fasteners 3800, which can be adapted to substantially nondestructively mount the pair of feet to a first pair of foot mounting sites 3900. Second set of openings 3750 can be adapted to receive fasteners 3800, which can be adapted to substantially non-destructively mount the pair of feet to a second pair of foot mounting sites 3950. Each of first pair of foot mounting sites 3900 can be at an opposing end region of surface 3600 compared to a corresponding mounting site of second pair of foot mounting sites 3950.

Figure 4A:
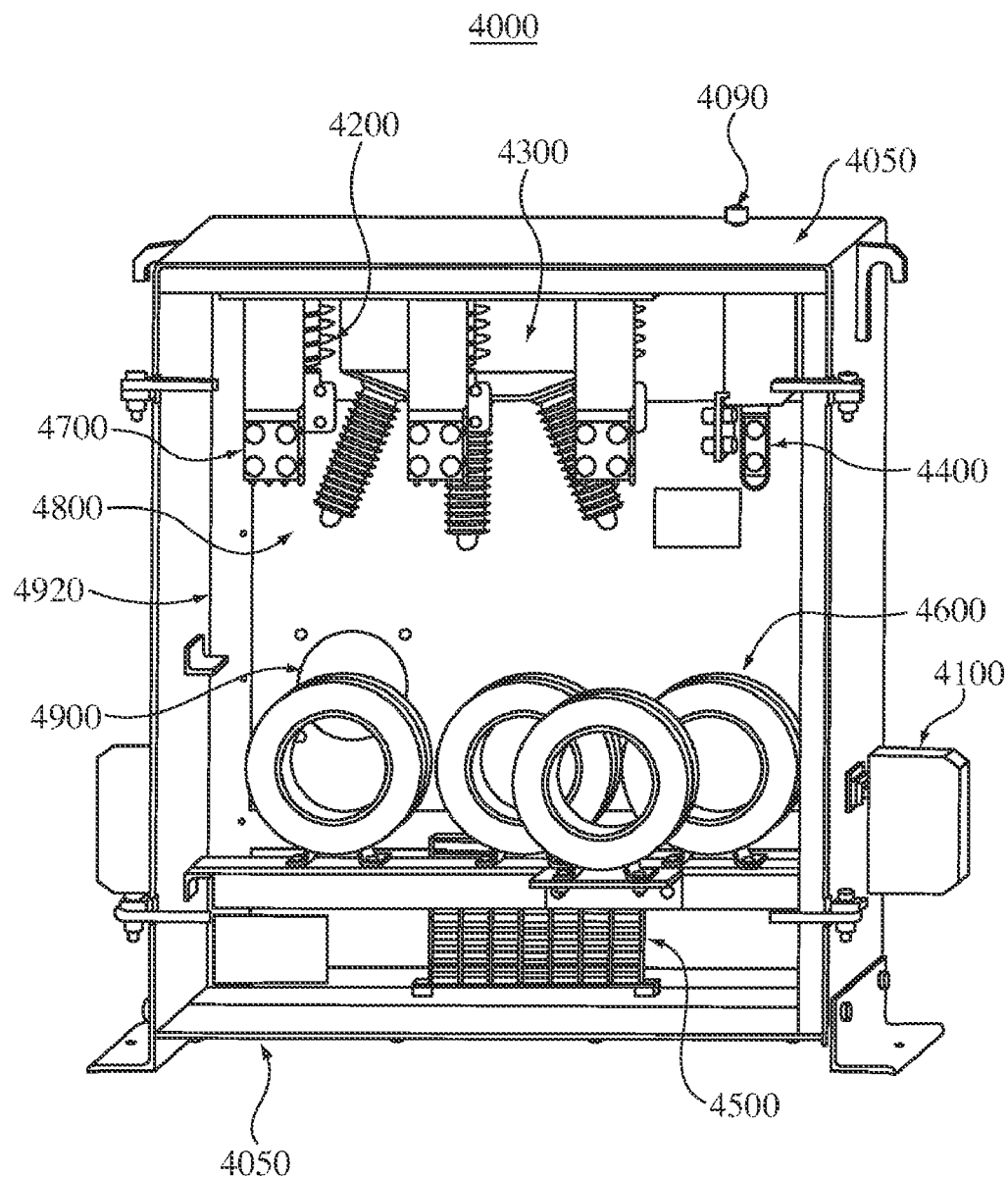
FIG. 4A is a perspective view of one exemplary embodiment of a terminal box system 4000.

FIG. 4A is a perspective view of an exemplary embodiment of a terminal box system 4000 that supports up to 6600 volts, which can comprise a terminal box 4050 and/or an auxiliary box 4100. Terminal box 4050 can be adapted to operatively house a plurality of components. The plurality of components can comprise at least one lightning arrester 4200, surge capacitor 4300, bus bar 4400, space heater 4500, current transformer 4600, and/or set of terminals 4700. Terminal box 4050 can comprise a substantially non-destructively releasably attachable back plate 4800. Releasably attachable back plate 4800 can define a conductor opening 4900 adapted to substantially non-destructively receive a plurality of electrical wires. Responsive to a flip or a rotation of back plate 4800, conductor opening 4900 can be adapted to be operatively positioned in any of four quadrants of a back plate opening 4920 defined by terminal box 4050 and substantially covered by back plate 4800. Lightning arrester 4200, surge capacitor 4300, bus bar 4400, and/or space heater 4500 can be adapted to be substantially housed within terminal box 4050. Bus bar 4400 can be a silver plated bus bar.

Auxiliary box 4100 can be adapted to be operatively coupled to terminal box 4050 and can be used to couple an electric motor operatively thereto. Terminal box 4050 can comprise and/or define a breather drain 4090, which can be adapted to drain moisture that enters and/or is condensed within terminal box 4050.

Figure 4B:
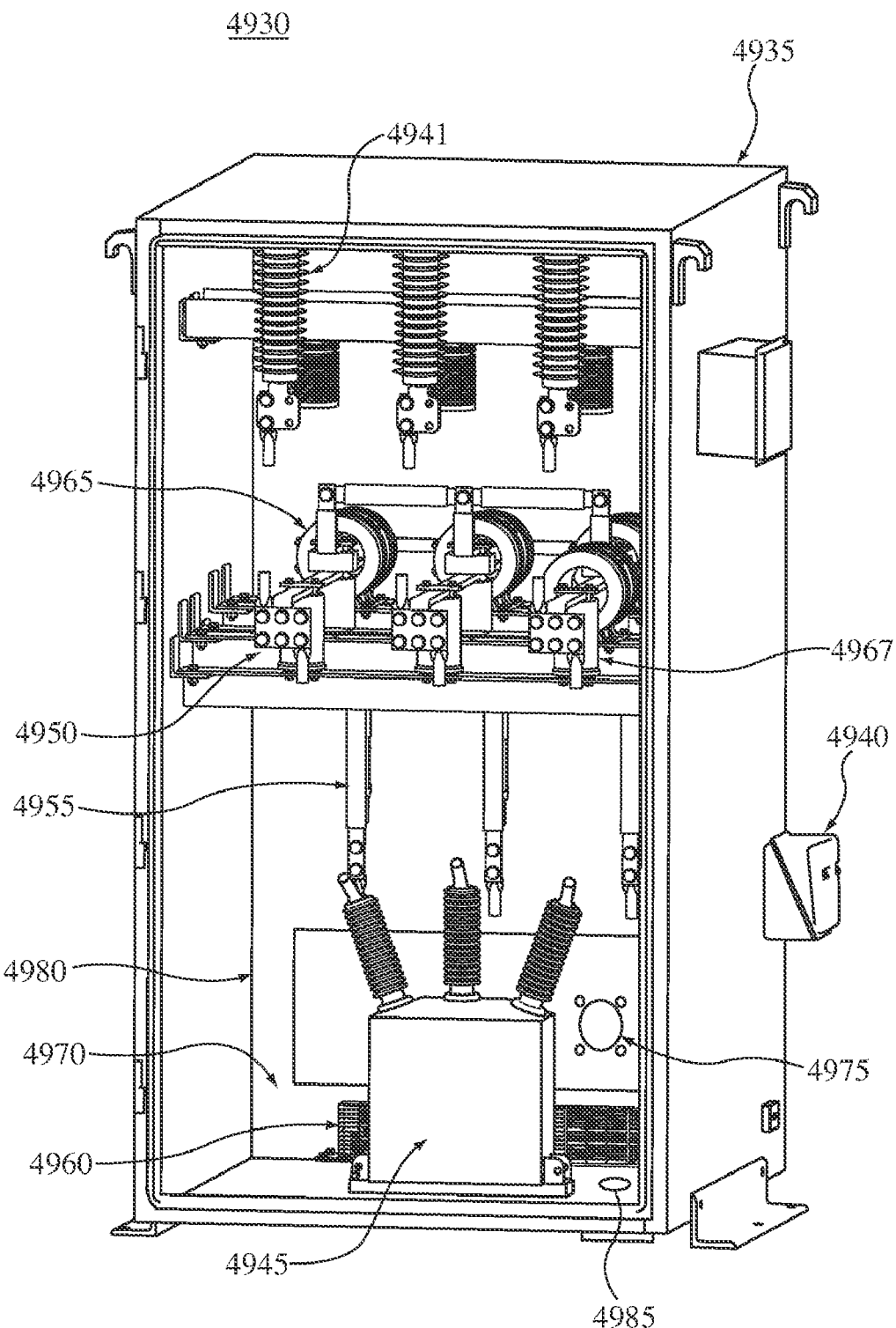
FIG. 4B is a perspective view of another exemplary embodiment of a terminal box system 4930.

FIG. 4B is a perspective view of an exemplary embodiment of a terminal box system 4930 that supports from 6600 to 13,800 volts, which can comprise a terminal box 4935 and/or an auxiliary box 4940. Terminal box 4935 can be adapted to operatively house a plurality of components. The plurality of components can comprise at least one lightning arrester 4941, surge capacitor 4945, bus bar 4950, rigid insulated bus bar 4955, space heater 4960, current transformer 4965 and stand-off insulators 4967. Terminal box 4935 can comprise a substantially non-destructively releasably attachable back plate 4970. Releasably attachable back plate 4970 can define a conductor opening 4975 adapted to substantially non-destructively receive a plurality of electrical wires. Responsive to a flip or a rotation of back plate 4970, conductor opening 4975 can be adapted to be operatively positioned in any of four quadrants of a back plate opening 4980 defined by terminal box 4935 and substantially covered by back plate 4970. Lightning arrester 4941, surge capacitor 4945, bus bar 4950, rigid insulated bus bar 4955, and/or space heater 4960 can be adapted to be substantially housed within terminal box 4935. Bus bar 4950 can be a silver plated bus bar.

Auxiliary box 4940 can be adapted to be operatively coupled to terminal box 4935 and can be used to couple an electric motor operatively thereto. Terminal box 4935 can comprise and/or define a breather drain 4985, which can be adapted to drain moisture that enters and/or is condensed within terminal box 4935.

Figure 5:
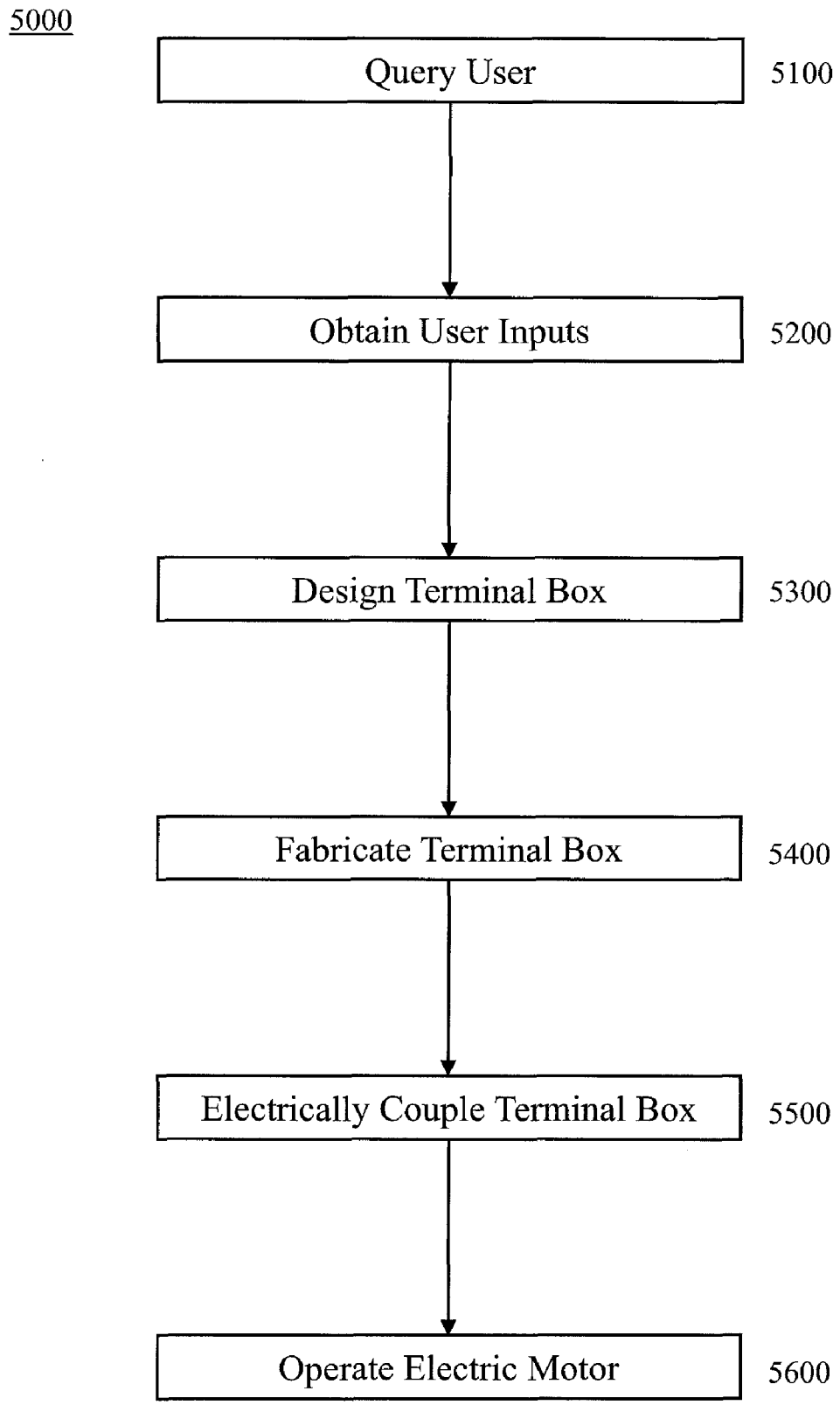
FIG. 5 is a flowchart of an exemplary embodiment of a method 5000.

FIG. 5 is a flowchart of an exemplary embodiment of a method 5000. At activity 5100, a user can be queried regarding specifications for a terminal box. The user can be queried manually by an engineering entity and/or automatically via an information device via a graphical user interface.

At activity 5200, inputs can be obtained from the user regarding desires and/or specifications for the terminal box. These inputs can be manually and/or automatically transferred to a design entity, which can be adapted to provide the terminal box and/or components therein responsive to the specifications for the terminal box.

At activity 5300, the terminal box can be automatically designed responsive to the user inputs. The terminal box can be adapted to be substantially non-destructively releasably and/or operatively attached to a selected electric motor of a plurality of electric motors. The terminal box can be adapted to receive a plurality of electrical wires. The plurality of electrical wires can be adapted to convey electrical energy to the selected electric motor. The plurality of electric motors can have a power output of a range between approximately 500 horsepower and approximately 10,000 horsepower.

At activity 5400, the terminal box can be fabricated according to the automatic design and/or utilizing materials obtained based upon an automatically generated bill of materials. When operatively coupled to any of the plurality of electric motors, the terminal box can be adapted to house components operatively coupled to, and/or sized for, each of the plurality of electric motors. The components can comprise at least one lightning arrester, surge capacitor, bus bar, space heater, current transformer, and/or set of terminals, etc. The terminal box can comprise a substantially non-destructively releasably attachable back plate, which can define a conductor opening adapted to receive the plurality of electrical wires. Responsive to a flip or a rotation of the back plate, the conductor opening can be adapted to be operatively positioned in any of four quadrants of a back plate opening defined by the terminal box and substantially covered by the back plate.

At activity 5500, via the terminal box, an associated electric motor can be electrically coupled to an electrical energy source. The electric motor can be operatively coupled to a load, such as a pump adapted to transfer a petroleum product.

At activity 5600, the electric motor can be operated. Electrical energy can flow through a plurality of electric wires from the electrical energy source to the electric motor. The electric motor can be adapted to perform useful work such as the transfer of the petroleum product from a first location to a second location.

Figure 6:
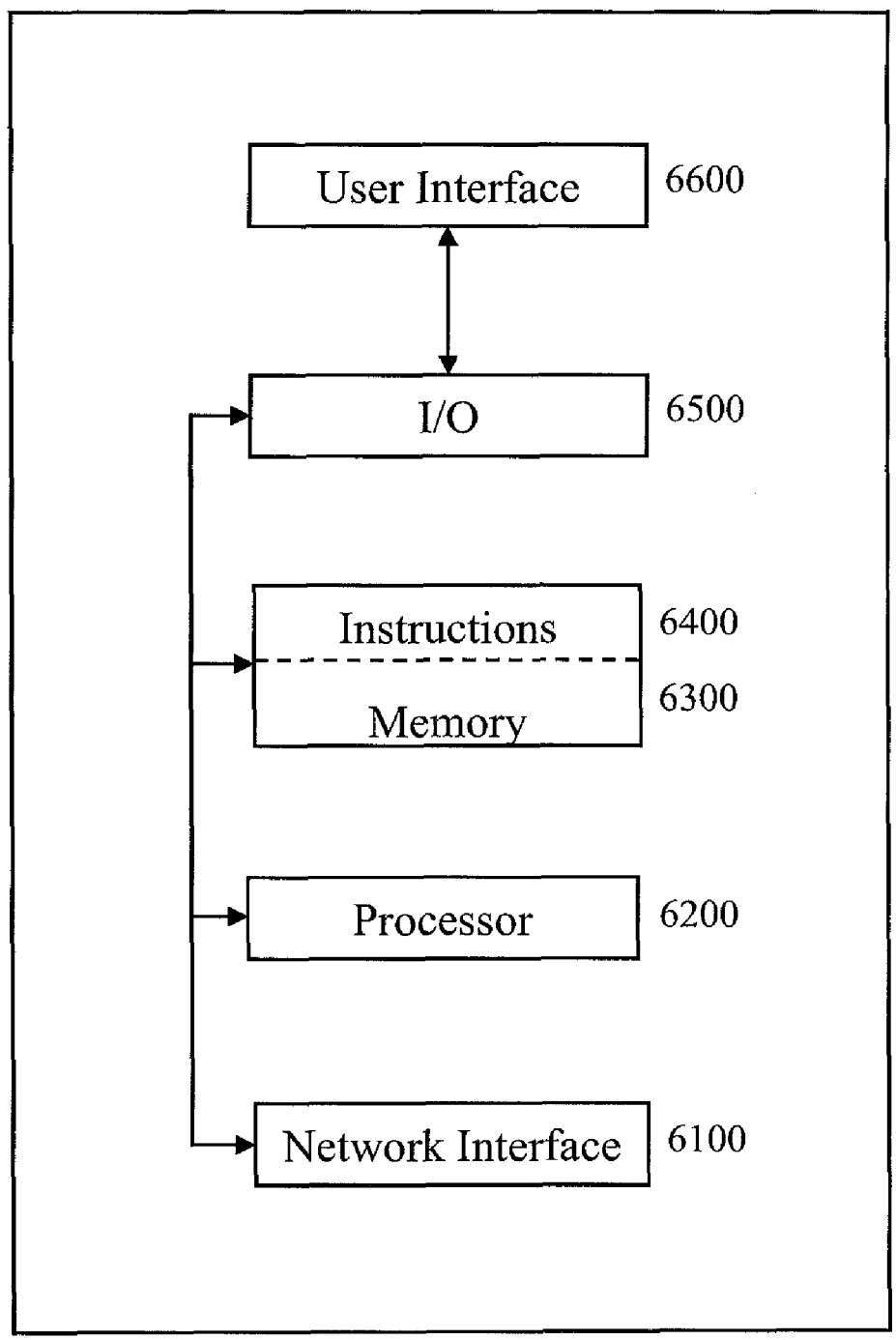
FIG. 6 is a block diagram of an exemplary embodiment of an information device 6000.

FIG. 6 is a block diagram of an exemplary embodiment of an information device 6000, which can comprise any of numerous components, such as for example, one or more network interfaces 6100, one or more processors 6200, one or more memories 6300 containing instructions 6400, one or more input/output (I/O) devices 6500, and/or one or more user interfaces 6600 coupled to I/O device 6500, etc.

In certain exemplary embodiments, via one or more user interfaces 6600, such as a graphical user interface, a user can view a rendering of information related to researching, designing, modeling, creating, developing, building, manufacturing, operating, maintaining, storing, marketing, selling, delivering, selecting, specifying, requesting, ordering, receiving, returning, rating, and/or recommending any of the products, services, methods, and/or information described herein, such as a rendering of information related to specifying, designing, and/or constructing a terminal box and/or components thereof.

Definitions

When the following terms are used substantively herein, the accompanying definitions apply. These terms and definitions are presented without prejudice, and, consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

a—at least one.
activity—an action, act, deed, function, step, and/or process and/or a portion thereof.
adapted to—suitable, fit, and/or capable of performing a specified function.
adjacent—in close proximity to, near, next to, and/or adjoining.
American Petroleum Institute—a petroleum and natural gas industry trade association that establishes specifications related to conveying and/or transporting petroleum products and/or natural gas.
and/or—either in conjunction with or in alternative to.
any—an unspecified selected one from a set.
apparatus—an appliance or device for a particular purpose.
approximately—about and/or nearly the same as.
associated with—related to.
at least—not less than.
attach—to fasten, secure, couple, and/or join.
attachable—capable of being fastened, secured, coupled, and/or joined.
automatically—acting and/or operating in a manner essentially independent of external human influence and/or control. For example, an automatic light switch can turn on upon "seeing" a person in its view, without the person manually operating the light switch.
auxiliary box—a housing adapted to enclose components related to those comprised within a terminal box.
back plate—a substantially planar substantially non-destructively releasably attachable portion of a terminal box that is adapted to cover at least a portion of an otherwise substantially open rear portion of the terminal box.
based upon—determined in consideration of and/or derived from.
between—in a separating interval and/or intermediate to.
blowout panel—a plate adapted to release excess electrical energy from a terminal box.
breather drain—an aperture adapted to drain moisture from a housing.
bus—an electrical conductor that makes a common connection between a plurality of circuits.
bus bar—a common electrical power terminal to which multiple circuits are electrically coupled through fuses and/or circuit breakers.
can—is capable of, in at least some embodiments.
capable—a potential for use.
cause—to bring about, provoke, precipitate, produce, elicit, be the reason for, result in, and/or effect.
compare—to examine in order to note similarities and/or differences in relation to something else.
compliant—in accordance with a specification and/or demand.
component—a constituent element and/or part.
comprised by—included by.
comprise—to include but not be limited to.
conductor—a component of a circuit breaker adapted to conduct a large majority of electrical current carried by the circuit breaker.
convey—to transmit, transport, guide, and/or carry.
corresponding—related, associated, accompanying, similar in purpose and/or position, conforming in every respect, and/or equivalent and/or agreeing in amount, quantity, magnitude, quality, and/or degree.
couple(d)—to join, connect, and/or link two things together.
cover—(n) a substantially planar object configured to protect and/or conceal; (v) to overlay, place upon and/or over.
current transformer—a device electrically and/or magnetically couplable to an electric circuit, the device adapted to output a secondary electrical current in response to the electrical current (the "primary current") in the electric circuit, the secondary current typically a predetermined ratio of the primary current.
define—to establish the meaning, relationship, outline, form, and/or structure of; and/or to precisely and/or distinctly describe and/or specify.
design—(n) a purposeful arrangement of parts and/or details. For example, the design of a product and/or process can comprise designing predetermined aspects of the product and/or process. (v) to plan, such as in a manner that comprises the development of a graphic representation.

determine—to obtain, calculate, decide, deduce, establish, and/or ascertain.

device—a machine, manufacture, and/or collection thereof.

each—every one of a group considered individually.

electrical—relating to producing, distributing, and/or operating by electricity.

electrical energy—energy characterized by the flow of electric charge through a conductor.

electric motor—a motion-imparting device powered by electricity.

electrical wires—insulated strands of an electrically conductive metal.

end region—a portion that is in a vicinity of an extreme edge of an object surface.

energy—usable power.

fabricate—to make and/or create.

fastener—a restraint that attaches to something and/or holds something in place. A fastener can be a screw, bolt, hook and/or loop of a hook and loop fastener system, button, hook, catch, snap, latch, buckle, loop, tie, clamp, connector, coupler, link, band, zipper, releasable adhesive, plug and socket, and/or any other releasable mechanism for attachment, and/or a glue, bond, weld, and/or any other permanent mechanism for attachment.

feet—components at and/or near an extreme edge of an object that are adapted to rest on a surface and provide support for weight of the object.

first—an initial entity in an ordering.

flip—to turn over.

for—with a purpose of.

frame size—a designation that relates to a standardized set of motor dimensions that includes one or more of bolt hole size, mounting base dimensions, shaft height, shaft diameter, and shaft length.

from—used to indicate a source.

further—in addition.

greater—larger and/or more than.

group—a plurality of determined units.

have—to be identified by.

heat—energy associated with the motion of atoms and/or molecules and capable of being transmitted through solid and fluid media by conduction, through fluid media by convection, and through a fluid and/or empty space by radiation.

height—a measurement of the extent of something along a dimension.

hook—a curved or angular protrusion adapted to catch, pull, hold, and/or suspend something.

horsepower—a unit of rate of doing work that equals approximately 746 watts.

house—to enclose, cover, and/or protect.

inch—a unit of linear measurement in the English system equal to approximately 2.54 cm.

information—facts, terms, concepts, phrases, expressions, commands, numbers, characters, and/or symbols, etc., that are related to a subject. Sometimes used synonymously with data, and sometimes used to describe organized, transformed, and/or processed data. It is generally possible to automate certain activities involving the management, organization, storage, transformation, communication, and/or presentation of information.

information device—any device on which resides a finite state machine capable of implementing at least a portion of a method, structure, and/or or graphical user interface described herein. An information device can comprise well-known communicatively coupled components, such as one or more network interfaces, one or more processors, one or more memories containing instructions, one or more input/output (I/O) devices, and/or one or more user interfaces (e.g., coupled to an I/O device) via which information can be rendered to implement one or more functions described herein. For example, an information device can be any general purpose and/or special purpose computer, such as a personal computer, video game system (e.g., PlayStation, Nintendo Gameboy, X-Box, etc.), workstation, server, minicomputer, mainframe, supercomputer, computer terminal, laptop, wearable computer, and/or Personal Digital Assistant (PDA), iPod, mobile terminal, Bluetooth device, communicator, "smart" phone (such as a Treo-like device), messaging service (e.g., Blackberry) receiver, pager, facsimile, cellular telephone, a traditional telephone, telephonic device, a programmed microprocessor or microcontroller and/or peripheral integrated circuit elements, a digital signal processor, an ASIC or other integrated circuit, a hardware electronic logic circuit such as a discrete element circuit, and/or a programmable logic device such as a PLD, PLA, FPGA, or PAL, or the like, etc.

lack—a particular deficiency or absence.

length—a longest dimension of something and/or the measurement of the extent of something along its greatest dimension.

less than—having a measurably smaller magnitude and/or degree as compared to something else.

lifting hook—a device and/or system adapted to receive a motive force to vertically raise the hook and/or an object coupled thereto.

lightning arrestor—a device and/or system adapted to shunt and/or divert electrical energy of a lighting strike to an earthed ground.

machine instructions—directions adapted to cause a machine, such as an information device, to perform one or more particular activities, operations, and/or functions. The directions, which can sometimes form an entity called a "processor", "kernel", "operating system", "program", "application", "utility", "subroutine", "script", "macro", "file", "project", "module", "library", "class", and/or "object", etc., can be embodied as machine code, source code, object code, compiled code, assembled code, interpretable code, and/or executable code, etc., in hardware, firmware, and/or software.

machine-readable—of a form from which an information device can obtain data and/or information.

machine-readable medium—a physical structure from which a machine, such as an information device, computer, microprocessor, and/or controller, etc., can obtain and/or store data, information, and/or instructions. Examples include memories, punch cards, and/or optically-readable forms, etc.

magnetic—having the property of attracting iron and certain other materials by virtue of a surrounding field of force.

manufacturing entity—a person, team, role, organization, computer, and/or application that constructs something.

may—is allowed and/or permitted to, in at least some embodiments.

memory—a device capable of storing analog or digital information, for example, a non-volatile memory, volatile memory, Random Access Memory, RAM, Read Only Memory, ROM, flash memory, magnetic media, a hard disk, a floppy disk, a magnetic tape, an optical media, an optical disk, a compact disk, a CD, a digital versatile disk, a DVD, and/or a raid array, etc. The memory can be coupled to a processor and can store instructions adapted to be executed by processor according to an embodiment disclosed herein.

method—a process, procedure, and/or collection of related activities for accomplishing something.

more—in greater quantity.

mount—(n) that upon which a thing is attached. (v) to couple, fix, and/or attach on and/or to something.

National Electrical Manufacturers Association (NEMA)—a trade association that establishes standards used in electrical products.

NEMA 4 Enclosure—fabricated in accordance with the current NEMA 4 enclosure specification in NEMA Standards Publication No. 250.

NEMA/ANSI type II—fabricated in accordance with the current type II specification in NEMA Standards Publication No. 250.

non-destructively—of, relating to, or being a process that does not result in damage to the subject material and/or product and/or results in such minimal damage that the subject material and/or product can be re-used for its intended purpose.

obtain—to receive, get, take possession of, procure, acquire, calculate, determine, and/or compute.

opening—an aperture.

operative—being in effect; operating.

opposing—opposite; against; being the other of two complementary or mutually exclusive things; placed or located opposite, in contrast, in counterbalance, and/or across from something else and/or from each other.

outside—the space beyond a boundary and/or limit.

pair—a quantity of two of something.

plurality—the state of being plural and/or more than one.

portion—a part, component, section, percentage, ratio, and/or quantity that is less than a larger whole. Can be visually, physically, and/or virtually distinguishable and/or non-distinguishable.

position—(n) a location; (v) to put in a location.

power—energy, a measure of energy and/or work, and/or a rate at which work is done, expressed as the amount of work per unit time and commonly measured in units such as watt and horsepower.

power output—provided electric power.

produce—to generate via a physical effort.

predetermined—established in advance.

processor—a device and/or set of machine-readable instructions for performing one or more predetermined tasks. A processor can comprise any one or a combination of hardware, firmware, and/or software. A processor can utilize mechanical, pneumatic, hydraulic, electrical, magnetic, optical, informational, chemical, and/or biological principles, signals, and/or inputs to perform the task(s). In certain embodiments, a processor can act upon information by manipulating, analyzing, modifying, converting, transmitting the information for use by an executable procedure and/or an information device, and/or routing the information to an output device. A processor can function as a central processing unit, local controller, remote controller, parallel controller, and/or distributed controller, etc. Unless stated otherwise, the processor can be a general-purpose device, such as a microcontroller and/or a microprocessor, such the Pentium IV series of microprocessor manufactured by the Intel Corporation of Santa Clara, Calif. In certain embodiments, the processor can be dedicated purpose device, such as an Application Specific Integrated Circuit (ASIC) or a Field Programmable Gate Array (FPGA) that has been designed to implement in its hardware and/or firmware at least a part of an embodiment disclosed herein.

provide—to furnish, supply, give, convey, send, and/or make available.

quadrant—one of four parts into which a plane is divided by two substantially perpendicular lines.

range—a measure of an extent of a set of values and/or an amount and/or extent of variation.

receive—to gather, take, acquire, obtain, accept, get, and/or have bestowed upon.

regarding—pertaining to.

release—to let go and/or free from something that restrains, binds, fastens, and/or holds back.

releasably—capable of being freed, in a substantially non-destructive manner, from something that binds, fastens, or holds back.

responsive—reacting to an influence and/or impetus.

rotation—an act and/or process of turning around a center and/or an axis.

said—when used in a system or device claim, an article indicating a subsequent claim term that has been previously introduced.

second—an entity immediately following a first entity in an ordering.

selected—a chosen item.

set—a related plurality of predetermined elements; and/or one or more distinct items and/or entities having a specific common property or properties.

silver plated—coated with a layer of silver.

site—a physical position of something.

size—(n) physical dimensions, proportions, magnitude, amount, and/or extent of an entity; (v) to determine physical dimensions, proportions, magnitude, amount, and/or extent of an entity.

source—a point at which something originates, springs into being, and/or from which it derives and/or is obtained.

space heater—a device adapted to warm a defined volume of air.

standard—one or more settled criterion.

substantially—to a considerable, large, and/or great, but not necessarily whole and/or entire, extent and/or degree.

surface—the outer boundary of an object or a material layer constituting or resembling such a boundary.

surge capacitor—a device adapted to absorb surges of electrical energy and/or reduce a steepness of an electrical energy wave front.

system—a collection of mechanisms, devices, data, and/or instructions, the collection designed to perform one or more specific functions.

temperature—measure of the average kinetic energy of the molecules in a sample of matter, expressed in terms of units or degrees designated on a standard scale.

terminal box—a housing adapted to contain a plurality of components adapted to electrically couple an electric motor to an electrical energy source.

utilize—to use and/or put into service.

via—by way of and/or utilizing.

when—at a time.

wherein—in regard to which; and; and/or in addition to.

width—a measurement of the extent of something along a dimension.

Note

Still other substantially and specifically practical and useful embodiments will become readily apparent to those skilled in this art from reading the above-recited and/or herein-included detailed description and/or drawings of certain exemplary embodiments. It should be understood that numerous variations, modifications, and additional embodiments are possible, and accordingly, all such variations, modifications, and embodiments are to be regarded as being within the scope of this application.

Thus, regardless of the content of any portion (e.g., title, field, background, summary, abstract, drawing figure, etc.) of this application, unless clearly specified to the contrary, such as via an explicit definition, assertion, or argument, with respect to any claim, whether of this application and/or any claim of any application claiming priority hereto, and whether originally presented or otherwise:

- there is no requirement for the inclusion of any particular described or illustrated characteristic, function, activity, or element, any particular sequence of activities, or any particular interrelationship of elements;
- any elements can be integrated, segregated, and/or duplicated;
- any activity can be repeated, performed by multiple entities, and/or performed in multiple jurisdictions; and
- any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

Accordingly, every portion (e.g., title, field, background, summary, abstract, drawing figure, etc.) of this application, other than the claims themselves, is to be regarded as illustrative in nature, and not as restrictive.

What is claimed is:

1. A system comprising:
   a terminal box supporting at least 6600 volts substantially non-destructively releasably and operatively attached to an electric motor selected from the group consisting of power output of a range between approximately 500 horsepower and approximately 10,000 horsepower;
   said terminal box coupled to a plurality of electrical wires conveying electrical power to said electric motor, when operatively coupled to said electric motor, said terminal box housing one or more components operatively coupled to, and sized for said electric motor, said components selected from the group consisting of a lightning arrester, a surge capacitor, bus bars, a space heater, a plurality of current transformers, and a plurality of terminals;
   said terminal box further comprising at least one side having:
   - respective first and second hook openings defined therein on opposite ends thereof;
   - respective first and second foot openings defined therein on opposite ends thereof;
   - at least one lifting hook non-destructively fastened to a hook opening on one end of the at least one side;
   - at least one foot non-destructively fastened to a foot opening on the opposite end of the at least one side; and
   - a substantially non-destructively releasably attachable back plate, said back plate defining a conductor opening adapted to receive said plurality of electrical wires, responsive to a flip or a rotation of said back plate, said conductor opening adapted to be operatively positioned in any of four quadrants of a back plate opening defined by said terminal box and substantially covered by said back plate.

2. The system of claim 1, further comprising:
   a current transformer magnetically coupled to one of said plurality of electrical wires.

3. The system of claim 1, further comprising:
   a surge capacitor substantially housed within said terminal box.

4. The system of claim 1, further comprising:
   a lightning arrestor substantially housed within said terminal box.

5. The system of claim 1, further comprising:
   a silver plated bus bar substantially housed within said terminal box.

6. The system of claim 1, further comprising:
   a terminal box space heater substantially housed within said terminal box and to heat said terminal box.

7. The system of claim 1, further comprising:
   an auxiliary box operatively coupled to said terminal box.

8. The system of claim 1, wherein said terminal box comprises a blowout panel, said blowout panel adapted to release energy from said terminal box.

9. The system of claim 1, wherein said terminal box defines a breather drain.

10. The system of claim 1, wherein said terminal box is compliant with American Petroleum Institute standards for electric motor terminal boxes.

11. The system of claim 1, wherein said terminal box is compliant with NEMA/ANSI type II terminal box standards.

* * * * *